(12) United States Patent
Kiya et al.

(10) Patent No.: US 11,343,901 B2
(45) Date of Patent: May 24, 2022

(54) PRINTED-CIRCUIT BOARD

(71) Applicant: NIPPON MEKTRON, LTD., Tokyo (JP)

(72) Inventors: Kenji Kiya, Tokyo (JP); Tomoki Kanayama, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 17/148,879

(22) Filed: Jan. 14, 2021

(65) Prior Publication Data

US 2021/0243879 A1 Aug. 5, 2021

(30) Foreign Application Priority Data

Feb. 5, 2020 (JP) .............................. JP2020-018038

(51) Int. Cl.
*H05K 1/02* (2006.01)
*H05K 1/16* (2006.01)
*H05K 1/03* (2006.01)

(52) U.S. Cl.
CPC ......... *H05K 1/0201* (2013.01); *H05K 1/0293* (2013.01); *H05K 1/032* (2013.01); *H05K 1/16* (2013.01); *H05K 2201/0129* (2013.01); *H05K 2201/062* (2013.01); *H05K 2201/10181* (2013.01)

(58) Field of Classification Search
CPC ........ H05K 1/0293; H05K 1/021; H05K 1/16; H05K 1/032
See application file for complete search history.

(56) References Cited

U.S. PATENT DOCUMENTS

2018/0198110 A1 7/2018 Zeng

FOREIGN PATENT DOCUMENTS

| JP | H0636672 A | * | 2/1994 | ........... H05K 1/0293 |
| JP | 2007-311467 A | | 11/2007 | |
| JP | 2018-113438 A | | 7/2018 | |
| WO | WO 9929147 A1 | * | 6/1999 | ........... H05K 1/0293 |

OTHER PUBLICATIONS

Machine translation of JP H0636672 A (Feb. 1994) (Year: 1994).*

* cited by examiner

*Primary Examiner* — Jeremy C Norris
(74) *Attorney, Agent, or Firm* — Studebaker & Brackett PC

(57) ABSTRACT

A printed-circuit board includes: a film-shaped thermoplastic base member having plasticity; a pattern fuse formed from a metal foil layer provided on a principal surface of the base member; a cover member covering at least part of the pattern fuse from an opposite side of the base member; and a first heat-resistant protection film provided on a region overlapping with at least part of the pattern fuse and covering the pattern fuse from a cover member side.

11 Claims, 3 Drawing Sheets

PRINTED-CIRCUIT BOARD

CROSS-REFERENCE TO RELATED APPLICATION

This application claims priority from Japanese Patent Application No. 2020-018038 filed with the Japan Patent Office on Feb. 5, 2020, the entire content of which is hereby incorporated by reference.

BACKGROUND

1. Technical Field

One aspect of the present disclosure relates to a printed-circuit board.

2. Related Art

There has been a circuit having a board, a wire formed on the board, and an electronic component connected to the wire. The board used for such a circuit includes one on which a fuse is formed. This fuse is used for reducing, when an abnormality of the electronic component has been caused, spreading of the abnormality to other electronic components or circuits.

In some cases, a wire formed from a thin film of a metal layer and a fuse are simultaneously formed on a printed-circuit board having the wire. Unlink a fuse as an electronic component, a pattern fuse formed at the step of forming a wire does not require the step of mounting the fuse on a printed-circuit board. Further, the pattern fuse is advantages in reduction in a manufacturing cost.

A fuse unit of a printed-circuit board is described in JP-A-2018-113438. A pattern fuse is, for example, described in JP-A-2007-311467. JP-A-2007-311467 describes that a wire and an electronic component are electrically connected to each other by soldering on a land. In the technique described in JP-A-2007-311467, a pattern in a shape completely covering the pattern fuse is printed. In such pattern printing, the pattern is printed in a color brighter than the color of a printed-circuit board. Due to thermal cutting of the pattern fuse, part of the printed pattern is removed. Moreover, burnout due to thermal cutting appears as a burnout mark on the printed pattern. The technique described in JP-A-2007-311467 is a technique for assessing thermal cutting of the pattern fuse in one glance based on a difference in contrast between the printed pattern and the burnout mark.

SUMMARY

A printed-circuit board includes: a film-shaped thermoplastic base member having plasticity; a pattern fuse formed from a metal foil layer provided on a principal surface of the base member; a cover member covering at least part of the pattern fuse from an opposite side of the base member; and a first heat-resistant protection film provided on a region overlapping with at least part of the pattern fuse and covering the pattern fuse from a cover member side.

DETAILED DESCRIPTION

Figure 1:
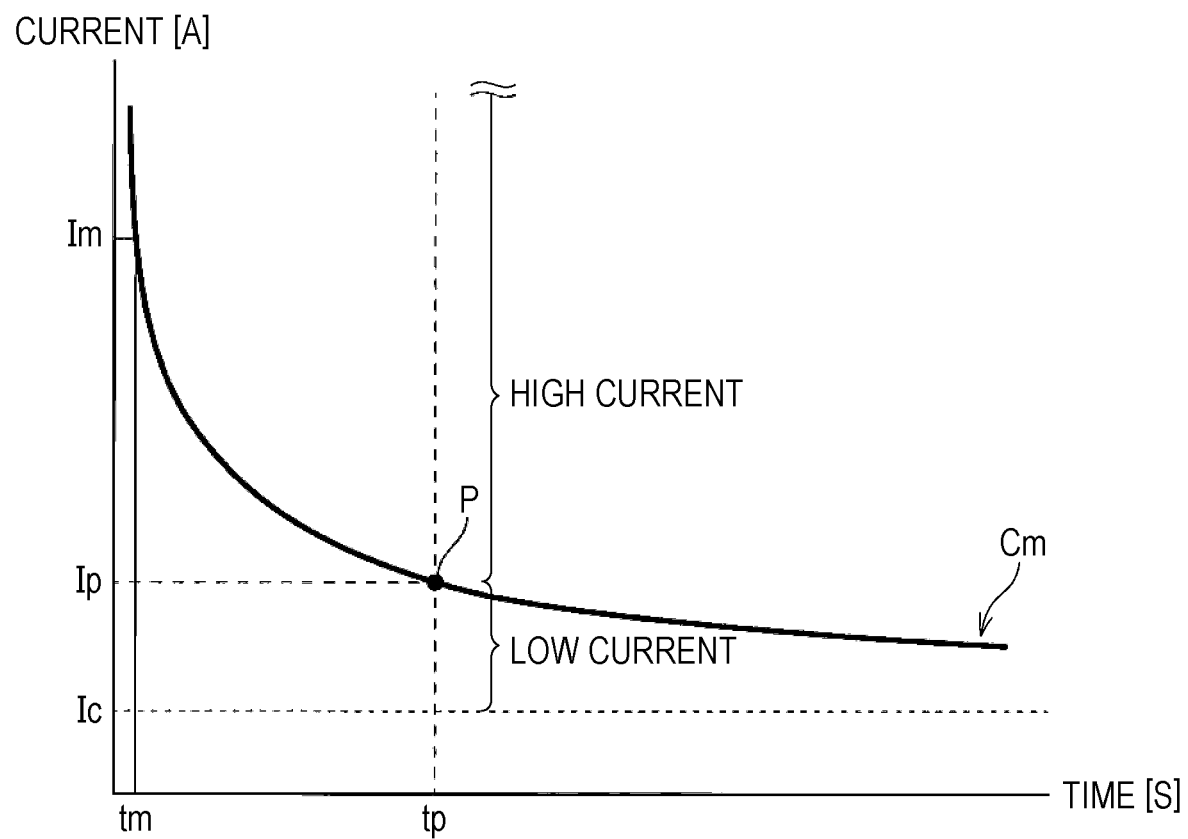
FIG. 1 is a graph for describing thermal cut characteristics of a pattern fuse.

In the following detailed description, for purpose of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Currently, the following flexible board (flexible printed circuits (FPC)) has been used in various fields. On this flexible board, copper foil is formed on a film-shaped base member having flexibility, and is processed into a wire. A pattern fuse is formed on the flexible board. For the purpose of, e.g., protecting the wire, a cover film and a reinforcing film are formed on the pattern fuse and the wire.

The pattern width and thickness of the pattern fuse are designed such that the pattern fuse is, in advance of the wire, thermally cut with a preset thermal cut current within preset thermal cut time. On this point, even in a case where a lower current than the thermal cut current has continuously flowed over time longer than the thermal cut time, the fuse is thermally cut in some cases. In this case, it relatively takes time to thermally cut the fuse. For this reason, there is a probability that the reinforcing film at a layer above the cover film is deteriorated due to heat generated during such time and short circuit is caused due to exposure of the fuse and contact of the fuse with a foreign substance or a dew drop. In a case where a relatively-high current of equal to or lower than the thermal cut current has flowed over time longer than the thermal cut time, the reinforcing film and the like receive high heat over long time until the pattern fuse is thermally cut. For this reason, there is a probability that the reinforcing film and the like ignite.

One object of the present disclosure is to provide a properly-functioning highly-reliable printed-circuit board capable of reducing occurrence of ignition and short circuit even in a case where a current of equal to or lower than a thermal cut current has flowed over thermal cut time or longer.

A printed-circuit board according to an aspect of the present disclosure includes: a film-shaped thermoplastic base member having plasticity; a pattern fuse formed from a metal foil layer provided on a principal surface of the base member; a cover member covering at least part of the pattern fuse from an opposite side of the base member; and a first heat-resistant protection film provided on a region overlapping with at least part of the pattern fuse and covering the pattern fuse from a cover member side.

According to one aspect of the present disclosure, occurrence of ignition and short circuit can be reduced even in a case where a current of equal to or lower than the thermal cut current has flowed over the thermal cut time or longer. Thus, according to one aspect of the present disclosure, the properly-functioning highly-reliable printed-circuit board can be provided.

Hereinafter, one embodiment of the present disclosure will be described. The present embodiment describes, as an example, the technical idea and configuration of the present disclosure, and is not intended to limit specific shapes or dimensions thereof. Thus, the drawings described in the present embodiment do not necessarily precisely show an aspect ratio and a thickness ratio of the configuration of the present embodiment.

Thermal Cut Characteristics

In advance of specific description of the embodiment of the present disclosure, thermal cut characteristics on which the inventor(s) of the present invention has focused will be described.

FIG. 1 is a graph for describing thermal cut characteristics of a pattern fuse. In FIG. 1, the vertical axis indicates a current flowing in the pattern fuse, and the horizontal axis indicates time for which the current has flowed. In FIG. 1, a curve Cm indicating the thermal cut characteristics shows a correspondence between the current indicated by the vertical axis and time until the pattern fuse is melted and loses electrical conduction in a case where the current has flowed. A rated current Ic shown in FIG. 1 is a rated current of equipment including the pattern fuse.

The thickness, width and the like of the pattern fuse showing the thermal cut characteristics of FIG. 1 are designed such that the pattern fuse is thermally cut at thermal cut time tm in a case where a thermal cut current Im has flowed. The pattern fuse is thermally cut at time longer than the thermal cut time tm when a current lower than the thermal cut current Im has flowed in the pattern fuse.

For reducing exposure, the pattern fuse may include, for example, a heat-resistant protection film made of high heat-resistant resin such as polyimide-based (PI-based) resin. For example, when a current Ip corresponding to a point P on the curve Cm in FIG. 1 has flowed in such a pattern fuse over time tp, there is a probability that the heat-resistant protection film is damaged. The point P shown in FIG. 1 indicates a point at which damage of the heat-resistant protection film is likely to occur. The heat-resistant protection film is likely to be damaged in a case where the current Ip has flowed over the time tp, for example. A high current shown in FIG. 1 is such a current that damage of the heat-resistant protection film is likely to occur. A low current is a current lower than the high current and falling within a range higher than the rated current Ic.

The pattern fuse might contact external air and ignite due to damage of the heat-resistant protection film. When the pattern fuse ignites, there is a probability that part of the heat-resistant protection film is carbonized and is dropped onto the pattern fuse and the pattern fuse is brought into conduction after having been thermally cut.

The inventor(s) of the present invention has focused on the above-described phenomenon, and has arrived at a pattern fuse thermally cut as designed with a preset current at preset time even in a case where a high current has flowed in the pattern fuse.

Figure 2:
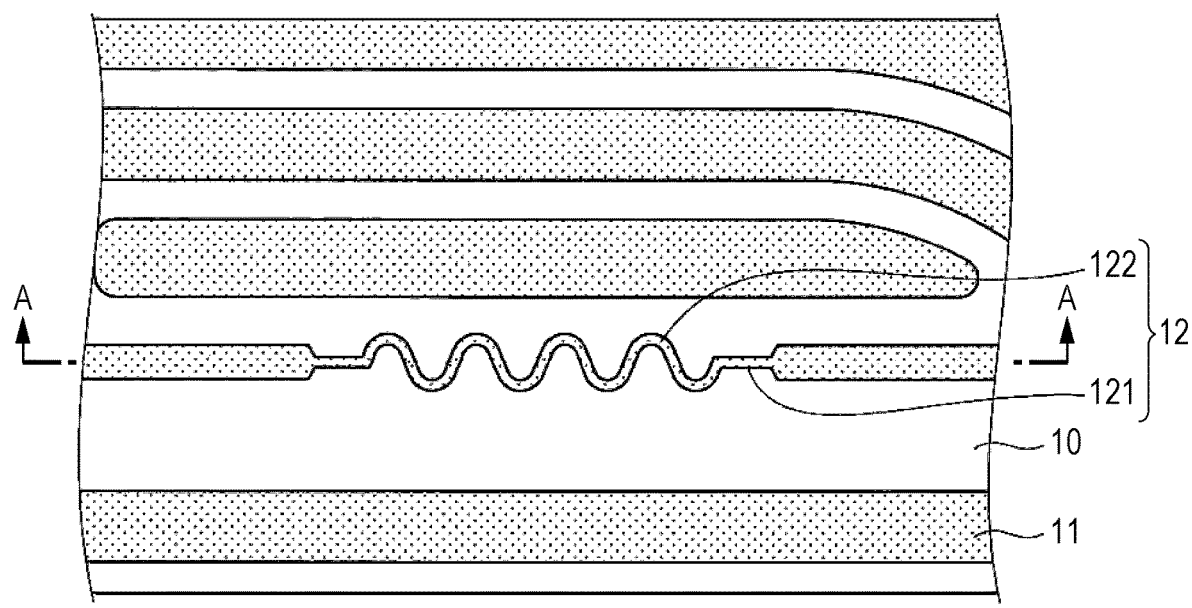
FIG. 2 is an upper view of a wire including a pattern fuse of one embodiment of the present disclosure.
Figure 3:
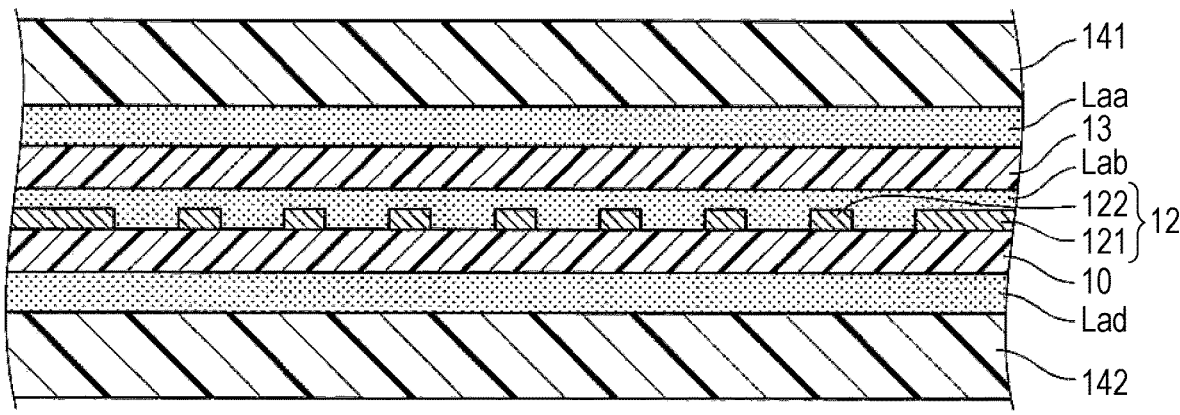
FIG. 3 is a longitudinal sectional view of a printed-circuit board of FIG. 2 along a section indicated by a chain line in FIG. 2.

FIG. 2 is an upper view of part of a printed-circuit board 1 of the present embodiment. FIG. 3 is a longitudinal sectional view when the section of the printed-circuit board 1 shown in FIG. 2 along a chain line of FIG. 2 is viewed from the direction of arrows A. The printed-circuit board 1 includes a film-shaped thermoplastic base member 10 having plasticity and a pattern fuse 12 formed from a metal foil layer provided on a principal surface of the base member 10.

Further, the printed-circuit board 1 includes a cover member 13 covering at least part of the pattern fuse 12 from the opposite side of the base member 10. Such a printed-circuit board 1 is configured such that the pattern fuse 12 is covered with the base member 10 containing thermoplastic resin and the cover member 13 from upper and lower sides.

A term "thermoplastic" as described herein means a property of being softened by heating and of being re-hardened by cooling.

In addition, the printed-circuit board 1 includes a heat-resistant protection film 141 as a first heat-resistant protection film provided on a region overlapping with at least part of the pattern fuse 12 and covering the pattern fuse 12 from a cover member 13 side. Further, the printed-circuit board 1 of the present embodiment includes a heat-resistant protection film 142 as a second heat-resistant protection film provided on a region overlapping with at least part of the pattern fuse 12 and covering the pattern fuse 12 from a base member 10 side.

In the present embodiment, the heat-resistant protection film 142 is the lowermost layer of the printed-circuit board 1, and the heat-resistant protection film 141 is the uppermost layer of the printed-circuit board 1. Such an upper-lower direction is set for describing the present embodiment, and is not a direction according to the direction of the force of gravity. Moreover, in the printed-circuit board 1 of the present embodiment, the cover member 13 and the heat-resistant protection film 141 are bonded to each other with an adhesive layer Laa as a thermoplastic adhesive for the first heat-resistant protection film. The pattern fuse 12 and the cover member 13 are bonded to each other with an adhesive layer Lab.

Moreover, the base member 10 and the heat-resistant protection film 142 are bonded to each other with an adhesive layer Lad as a thermoplastic adhesive for the second heat-resistant protection film. In the present embodiment, not only the adhesive layers Laa, Lad but also the adhesive layer Lab have thermal plasticity. Thus, when the pattern fuse 12 is thermally cut due to heat generation, the members, excluding the pattern fuse 12, between the heat-resistant protection film 141 and the heat-resistant protection film 142 are melted, and a continuous space is formed between the pattern fuse 12 and the heat-resistant protection film 141 or the heat-resistant protection film 142.

In the present embodiment, an adhesive layer may be further provided on a lower surface of the heat-resistant protection film 142. Moreover, other base members may be bonded using such an adhesive layer to form a multilayer printed-circuit board.

Hereinafter, each member shown in FIGS. 2 and 3 will be described.

Base Member

The base member 10 is a relatively-thin film-shaped base member having front and back surfaces as principal surfaces. It may only be required that the base member 10 is a base member containing a thermoplastic resin layer and having thermal plasticity across the entirety of the base member. Alternatively, the base member 10 may be, for example, made of thermoplastic resin, i.e., have a single thermoplastic resin layer, or may be a layer containing resin other than the thermoplastic resin. In the present embodiment, the material of the thermoplastic resin layer of the base member 10 is, for example, polyethylene naphthalate-based (PEN-based) resin. Note that the material of the thermoplastic resin layer of the base member 10 is not limited to the PEN-based resin. As such a material, polyethylene terephthalate (PET), liquid crystal polymer (LCP), fluorine-based resin (polytetrafluoroethylene (PTFE)), or resin containing these materials may be used. The PET-based resin glass-transitions at 80° C., and is melted and fluidized at 264° C. Specifically, the PEN-based resin has better heat resistance than that of the PET-based resin.

Pattern Fuse

The pattern fuse 12 is formed by processing of copper foil. The pattern fuse 12 has a narrow width portion 121 and a thermal cut portion 122. The narrow width portion 121 and the thermal cut portion 122 are formed between the pattern fuse 12 and a printed circuit 11 connected to the pattern fuse 12. The narrow width portion 121 has a narrower width than that of the printed circuit 11. The thermal cut portion 122 is designed to be thermally cut. The thermal cut portion 122 of the pattern fuse 12 has a pattern width narrower than that of the printed circuit 11, or has a pattern thickness smaller than that of the printed circuit 11. The thermal cut portion 122 is thermally cut in such a manner that a current of equal to or higher than a preset value flows over preset time or longer. Moreover, in the present embodiment, the thermal cut portion 122 is in a meander shape for ensuring the length of the thermal cut portion 122 and enhancing the electrical resistance of the thermal cut portion 122. In the pattern fuse 12, a portion removed by etching forms an air gap. The adhesive layer Lab enters at least part of the air gap.

Note that in the present embodiment, the shape of the thermal cut portion 122 is not limited to the meander shape. The thermal cut portion 122 may have any shape as long as the thermal cut portion 122 has a sufficiently-higher resistance than that of the printed circuit 11 and is configured to be thermally cut at predetermined thermal cut time or shorter in a case where a current of equal to or higher than a predetermined thermal cut current has flowed in the thermal cut portion 122. Note that it is not proper that a pattern obtained by mere narrowing of the printed circuit 11 functions as the thermal cut portion 122. For favorably thermally cutting the thermal cut portion 122 under a predetermined condition, distances from the printed circuit 11 and the narrow width portion 121 to the thermal cut portion 122 and the interval of turning back the thermal cut portion 122 are set.

The printed circuit 11 and the pattern fuse 12 are formed as follows, for example. That is, copper foil (metal foil) is bonded to one principal surface of the base member 10 to form a so-called copper-clad board having a copper foil layer (a metal foil layer) provided on the principal surface of the base member 10. A resist material is applied onto the copper-clad board. The applied resist material is exposed to light, and in this manner, a resist pattern corresponding to the printed circuit 11 and the pattern fuse 12 is produced. Thereafter, the base member 10 is dipped in an etching solution so that the printed circuit 11 and the pattern fuse 12 can be formed. Alternatively, the pattern fuse 12 and the printed circuit 11 can be also formed in such a manner that conductive paste as ink is printed on the base member 10.

Cover Member

The cover member 13 covers at least part of the pattern fuse from the opposite side of the base member 10. In the present embodiment, the cover member 13 contains thermoplastic resin as in the base member 10. The cover member 13 may be a single thermoplastic resin layer, or may be a layer containing resin other than the thermoplastic resin. Note that in the present embodiment, the material of the thermoplastic resin of the cover member 13 is the PEN-based resin as the same type of material as the thermoplastic resin of the base member 10. The same type of material as described herein means not only that both materials are merely the thermoplastic resin material, but also that the resin types of both materials, such as the PEN-based resin or the PET-based resin, are the same as each other. Moreover, the same type of material may be a material formed by mixing of the same type of thermoplastic resin at the same ratio.

The thermoplastic resin of the cover member 13 and the thermoplastic resin of the base member 10 are the same type of material, and therefore, in the present embodiment, heat of the pattern fuse 12 having generated the heat is substantially uniformly transferred to the periphery of the pattern fuse 12. Accordingly, the resin at the periphery of the pattern fuse 12 is substantially equally melted.

A phrase "at least part of pattern fuse 12" may be the entirety or part of the narrow width portion 121 and the thermal cut portion 122. A phrase "the cover member 13 covers the pattern fuse 12 from the opposite side of the base member 10" means that the cover member 13 covers the pattern fuse 12 between the pattern fuse 12 and the heat-resistant protection film 141. Such coverage includes direct coverage of the pattern fuse 12 by the cover member 13 with the cover member 13 being adjacent to the pattern fuse 12 and indirect coverage of the pattern fuse 12 by the cover member 13 through other members.

Heat-Resistant Protection Film

The heat-resistant protection film 141 functions as a first heat-resistant member (the first heat-resistant protection film) provided on the region overlapping with at least part of the pattern fuse 12 and covering the pattern fuse 12 from the cover member 13 side. A phrase "at least part of the pattern fuse 12" means part or the entirety of the pattern fuse 12. Moreover, a phrase "overlapping" includes overlapping in direct contact and indirect overlapping through other members. A phrase "the heat-resistant protection film 141 covers the pattern fuse 12 from the cover member 13 side" means that the heat-resistant protection film 141 covers the pattern fuse 12 through the cover member 13.

The heat-resistant protection film 142 functions as the second heat-resistant protection film provided on the region overlapping with at least part of the pattern fuse 12 and covering the pattern fuse 12 from the base member 10 side. A phrase "the heat-resistant protection film 142 covers the pattern fuse 12 from the base member 10 side" means that the heat-resistant protection film 142 covers the pattern fuse 12 through the base member 10. In the printed-circuit board 1 of the present embodiment as described above, the pattern fuse 12 covered with the base member 10 and the cover member 13 having the thermoplastic resin layers is further covered with the heat-resistant protection films 141, 142 in the upper-lower direction.

Members with excellent heat-resistant softening properties are used as the heat-resistant protection films 141, 142. These members have melting points higher than the melting points of the cover member 13 and the base member 10. Alternatively, in a case where the materials of these members have no melting point, these members have higher decomposition temperatures than the melting points of the cover member 13 and the base member 10.

As the heat-resistant protection films 141, 142 of the present embodiment, PI-based resin, epoxy-based resin, liquid crystal polymer, or fluorine-based resin can be used. The PI-based resin has highest-level thermal, mechanical, and chemical properties in a high molecule. The PI-based resin has no melting point, and is thermally decomposed at about 500° C. In a case where the PI-based resin is used as an insulating material of an electronic circuit, strain due to a difference in thermal expansion between the PI-based resin and a metal wire is less likely to be caused, and therefore, wiring can be performed with high accuracy. The epoxy-based resin is a general term of thermosetting resin which can be hardened by cross-link networking by an epoxy group remaining in a high molecule. The epoxy-based resin is thermally decomposed at about 250° C. to 350° C.

For example, in a case where the PEN-based resin is used for the cover member 13 and the PI-based resin is used for the heat-resistant protection films 141, 142, the cover member 13 is melted at about 280° C., and the heat-resistant protection films 141, 142 are, without being melted, thermally decomposed at about 480° C. to 500° C. The cover member 13 and the heat-resistant protection films 141, 142 as described above satisfy the above-described conditions.

In the printed-circuit board 1 of the present embodiment, the copper-clad board formed in such a manner that the copper foil is stacked on the base member 10 is used. By etching of the copper foil, the pattern fuse 12 and the printed circuit 11 are formed. In a layer above the pattern fuse 12 and the printed circuit 11, the cover member 13 is provided through the adhesive layer Lab. In a layer above the cover member 13, the heat-resistant protection film 141 is provided through the adhesive layer Laa. The cover member 13 is bonded to the pattern fuse 12 with the adhesive layer Lab. The base member 10 and the heat-resistant protection film 142 are bonded to each other with the adhesive layer Lad. As the adhesive layers Laa, Lab, Lad, an adhesive or prepreg using, as a material, epoxy-based resin, acrylic-based resin, or PI-based resin is used, for example.

Next, a state in which the pattern fuse 12 is thermally cut in the printed-circuit board 1 described above will be described. The pattern fuse 12 generates heat when the thermal cut current shown in FIG. 1 flows. The pattern fuse 12 designed easily thermally cuttable with a high resistance in advance is thermally cut in advance of the printed circuit 11, and front and back portions of a thermally-cut location are separated from each other.

In operation described above, in a case where a high current which is lower than the thermal cut current, but might damage the heat-resistant protection films 141, 142 as the PI-based resin flows in the pattern fuse 12, the pattern fuse 12 is thermally cut over time equal to or longer than that in a case where the thermal cut current has flowed. The cover member 13 and the base member 10 are melted within such time, and are liquefied among the heat-resistant protection films 141, 142 and the pattern fuse 12. Meanwhile, the heat-resistant protection films 141, 142 having the melting points or the decomposition temperatures higher than the melting points of the cover member 13 and the base member 10 continuously cover the pattern fuse 12 without being melted or being thermally decomposed even after the cover member 13 and the base member 10 have been melted. The liquefied cover member 13 and the liquefied base member 10 move from the layer above the pattern fuse 12. As a result, the space is formed between the pattern fuse 12 and the heat-resistant protection film 141, 142. An air layer is formed inside these spaces. The air layer functions as a heat insulating member between the pattern fuse 12 and the heat-resistant protection film 141, 142. With this configuration, the heat-resistant protection films 141, 142 are less likely to be damaged even while a high current is flowing. Consequently, exposure of the pattern fuse 12 to the outside can be reduced.

The inventor(s) of the present invention has observed the pattern fuse 12 during and after thermal cut from above the heat-resistant protection film 141. In a case where a high current is flowing, it has been visually confirmed that the heat-resistant protection film 141 is expanded. At this point, it is assumed that the cover member 13 and the base member 10 are melted. Note that no melting or damage of the heat-resistant protection film 141 has been confirmed.

As described above, the printed-circuit board 1 of the present embodiment includes the film-shaped thermoplastic base member 10 having the plasticity, the pattern fuse 12 formed from the metal foil layer provided on the principal surface of the base member 10, and the cover member 13 covering at least part of the pattern fuse 12 from the opposite side of the base member 10. Further, the printed-circuit board 1 includes the heat-resistant protection film 141 provided on the region overlapping with at least part of the pattern fuse 12 and covering the pattern fuse 12 from the cover member 13 side.

With the cover member 13, the heat-resistant protection film 141 can be arranged with a distance from the pattern fuse 12 in the present embodiment. In a case where the pattern fuse 12 generates heat and the cover member 13 is melted, an air gap can be formed between the pattern fuse 12 and the heat-resistant protection film 141. With the air gap, heat of the pattern fuse 12 is less likely to be transferred to the heat-resistant protection film 141. As a result, deterioration of the heat-resistant protection film 141 can be reduced, and therefore, exposure of the pattern fuse 12 can be reduced. Since exposure of the pattern fuse 12 is reduced, ignition of the pattern fuse 12 due to contact with external air can be reduced in the present embodiment.

With the above-described configuration, even in a case where a current of equal to or lower than the thermal cut current has flowed over the thermal cut time or longer, occurrence of ignition or short circuit can be reduced in the printed-circuit board 1 of the present embodiment. Thus, according to the present embodiment, a properly-functioning highly-reliable printed-circuit board can be provided.

Moreover, in the present embodiment as described above, release of heat generated from the pattern fuse 12 to the outside can be reduced by the heat-resistant protection film 141. Thus, a relationship between the current flowing in the pattern fuse 12 and the time required for thermal cutting can be stabilized. Consequently, in the present embodiment, the design accuracy of the pattern fuse 12 can be enhanced.

Further, in the present embodiment, the heat-resistant protection film 142 is also provided on the lower side of the base member 10. Thus, ignition of the pattern fuse 12 due to exposure thereof on the lower side can be reduced. In addition, release of heat generated from the pattern fuse 12 from the lower side can be reduced. Consequently, the design accuracy of the pattern fuse 12 can be further enhanced.

First Variation

Next, a first variation of the embodiment described above will be described.

Figure 4:
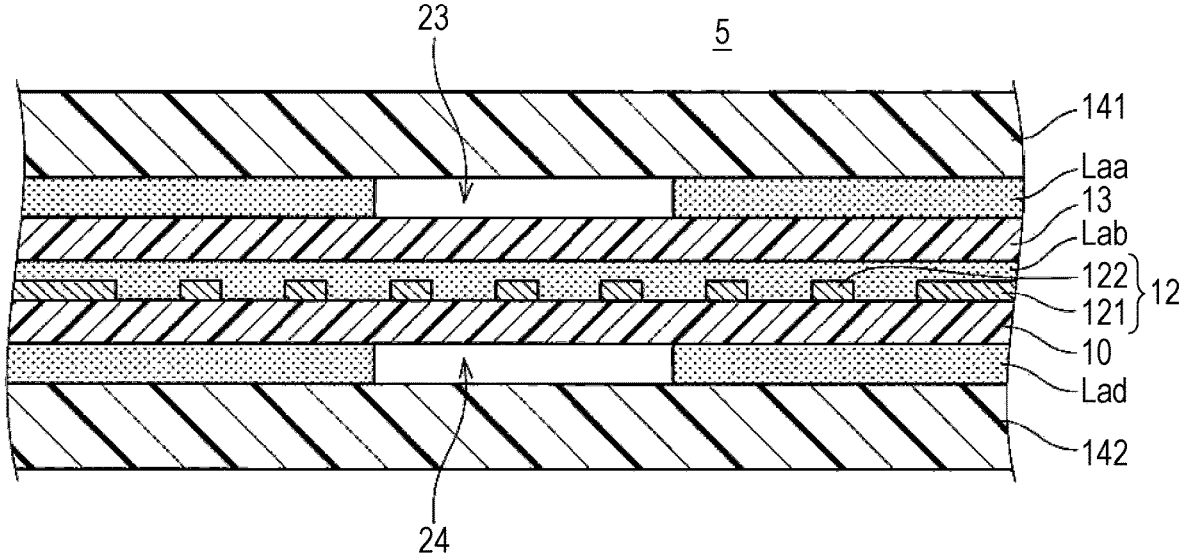
FIG. 4 is a sectional view for describing a printed-circuit board of a first variation.

FIG. 4 is a sectional view for describing a printed-circuit board 5 of the first variation. In the printed-circuit board 5, the adhesive layer Laa for the heat-resistant protection film 141 has an opening 23. The opening 23 opens at a region overlapping with part of the pattern fuse 12. The opening 23 is an air gap formed inside the adhesive layer Laa. Such a configuration is realized as follows, for example. That is, a resist for reducing application of the adhesive is applied to a surface of a portion of the cover member 13 corresponding to the opening 23. The adhesive is applied to the surface of the cover member 13 including the resist to form the adhesive layer Laa. In this manner, the opening 23 is formed in the adhesive layer Laa.

In the printed-circuit board 5 as described above, a great air gap is, due to heat generation of the pattern fuse 12, formed above the narrow width portion 121 within shorter time than formation of the space in the printed-circuit board 1. Thus, a high heat insulating effect can be obtained. The effect of reducing deterioration of the heat-resistant protection film 141 due to heat generated from the pattern fuse 12 can be more enhanced in the printed-circuit board 5 of the first variation.

Further, in the first variation, the opening 23 may be, in addition to air, filled with a member having a lower thermal conductivity than that of the cover member 13. With this configuration, in the printed-circuit board 5, heat generated from the pattern fuse 12 is less likely to be transferred to the upper heat-resistant protection film 141 as compared to the printed-circuit board 1, and therefore, the heat-resistant protection film 141 is less likely to be thermally decomposed. As such a member, phenol-based resin or inorganic particles of filler, mica and the like are conceivable, for example. The phenol-based resin may be applied to the cover member 13 through the opening 23 after the opening 23 has been formed. The inorganic particles may be applied with the inorganic particles in the form of powder or particle being mixed with the material of the cover member 13.

Note that depending on a ratio between the diameter of the opening 23 and the thickness of the adhesive layer Laa, the adhesive forming the adhesive layer Laa might enter the opening 23 and the opening 23 might be filled with the adhesive in some cases. In a case where such entrance of the adhesive into the opening 23 is acceptable, a material having a lower thermal conductivity than that of the cover member 13 is preferably selected as the material of the adhesive, or a material having a low thermal conductivity is preferably mixed with the adhesive. In a case where filling of the opening 23 with the adhesive having entered the opening 23 is not acceptable, the opening diameter of the opening 23 is sufficiently increased according to the thickness of the adhesive layer Laa such that entrance of the adhesive onto the pattern fuse 12 is reduced.

Further, in the variation, the adhesive layer Lad also has an opening 24 as shown in FIG. 4. The opening 24 opens at a region overlapping with part of the pattern fuse 12. The opening 24 is, as in the opening 23, an air gap formed inside the adhesive layer Lad. For example, the opening 24 is formed as follows. That is, a resist for reducing application of the adhesive is applied to a surface of a portion of the base member 10 corresponding to the opening 24. The adhesive is applied to the surface of the base member 10 including the resist to form the adhesive layer Lad. In this manner, the opening 24 is formed in the adhesive layer Lad.

In the printed-circuit board 5 including the opening 24 in the adhesive layer Lad, an air gap is formed below the pattern fuse 12 within shorter time than formation of the space in the printed-circuit board 1 after the base member 10 has been melted by heat generated from the pattern fuse 12. The air gap is filled with air or gas released from the base member 10. Thus, the air gap reduces transfer of heat generated from the pattern fuse 12 to the heat-resistant protection film 142.

In the printed-circuit board 5 of the variation as described above, heat insulating properties can be enhanced on the upper and lower sides of the pattern fuse 12. Thus, deterioration of the heat-resistant protection films 141, 142 can be more favorably reduced.

The above-described embodiment includes the following technical ideas.

(1) A printed-circuit board including a film-shaped thermoplastic base member having plasticity, a pattern fuse formed from a metal foil layer provided on a principal surface of the base member, a cover member covering at least part of the pattern fuse from the opposite side of the base member, and a first heat-resistant protection film provided on a region overlapping with at least part of the pattern fuse and covering the pattern fuse from a cover member side.

(2) The printed-circuit board of (1), in which the cover member contains thermoplastic resin.

(3) The printed-circuit board of (1) or (2), in which the cover member and the first heat-resistant protection film are bonded to each other with a thermoplastic adhesive for the first heat-resistant protection film.

(4) The printed-circuit board of (3), in which the adhesive for the first heat-resistant protection film has an opening which opens at a region overlapping with part of the pattern fuse.

(5) The printed-circuit board of any one of (1) to (4), which further includes a second heat-resistant protection film provided on a region overlapping with at least part of the pattern fuse and covering the pattern fuse from a base member side.

(6) The printed-circuit board of any one of (1) to (5), in which the base member contains thermoplastic resin.

(7) The printed-circuit board of (5) or (6), in which the base member and the second heat-resistant protection film are bonded to each other with a thermoplastic adhesive for the second heat-resistant protection film.

(8) The printed-circuit board of (7), in which the adhesive for the second heat-resistant protection film has an opening which opens at a region overlapping with part of the pattern fuse.

(9) The printed-circuit board of any one of (1) to (8), in which the base member and the cover member have the same type of material.

The foregoing detailed description has been presented for the purposes of illustration and description. Many modifications and variations are possible in light of the above teaching. It is not intended to be exhaustive or to limit the subject matter described herein to the precise form disclosed. Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims appended hereto.

What is claimed is:
1. A printed-circuit board comprising:
a film-shaped thermoplastic base member having plasticity;
a pattern fuse formed from a metal foil layer provided on a principal surface of the base member;
a cover member covering at least part of the pattern fuse from an opposite side of the base member;
a first heat-resistant protection film provided on a region overlapping with at least part of the pattern fuse and covering the pattern fuse from a cover member side; and a second heat-resistant protection film provided on a region overlapping with at least part of the pattern fuse and covering the pattern fuse from a base member side.

2. The printed-circuit board according to claim 1, wherein the cover member contains thermoplastic resin.

3. The printed-circuit board according to claim 1, wherein the base member contains thermoplastic resin.

4. The printed-circuit board according to claim 1, wherein the base member and the second heat-resistant protection film are bonded to each other with a thermoplastic adhesive for the second heat-resistant protection film.

5. The printed-circuit board according to claim 4, wherein the adhesive for the second heat-resistant protection film has an opening which opens at a region overlapping with part of the pattern fuse.

6. The printed-circuit board according to claim 1, wherein materials of the base member and the cover member are an identical type of material.

7. A printed-circuit board comprising:
a film-shaped thermoplastic base member having plasticity;
a pattern fuse formed from a metal foil layer provided on a principal surface of the base member;
a cover member covering at least part of the pattern fuse from an opposite side of the base member; and
a first heat-resistant protection film provided on a region overlapping with at least part of the pattern fuse and covering the pattern fuse from a cover member side, wherein
the cover member and the first heat-resistant protection film are bonded to each other with a thermoplastic adhesive for the first heat-resistant protection film.

8. The printed-circuit board according to claim 7, wherein the adhesive for the first heat-resistant protection film has an opening which opens at a region overlapping with part of the pattern fuse.

9. The printed-circuit board according to claim 7, wherein the cover member contains thermoplastic resin.

10. The printed-circuit board according to claim 7, wherein
the base member contains thermoplastic resin.

11. The printed-circuit board according to claim 7, wherein
materials of the base member and the cover member are an identical type of material.

* * * * *